(12) United States Patent
Hol et al.

(10) Patent No.: US 7,696,652 B2
(45) Date of Patent: Apr. 13, 2010

(54) ELECTROMAGNETIC ACTUATOR, METHOD OF MANUFACTURING A PART OF AN ELECTROMAGNETIC ACTUATOR, AND LITHOGRAPHIC APPARATUS COMPRISING AND ELECTROMAGNETIC ACTUATOR

(75) Inventors: Sven Antoin Johan Hol, Eindhoven (NL); Erik Roelof Loopstra, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 626 days.

(21) Appl. No.: 11/262,962

(22) Filed: Nov. 1, 2005

(65) Prior Publication Data
US 2007/0096566 A1 May 3, 2007

(51) Int. Cl.
*H02K 41/00* (2006.01)
(52) U.S. Cl. ..................... 310/12.01; 310/52
(58) Field of Classification Search ............. 310/12, 310/58, 64
See application file for complete search history.

(56) References Cited

U.S. PATENT DOCUMENTS

| 3,913,045 A | * | 10/1975 | Von Starck | 336/60 |
| 4,430,588 A | * | 2/1984 | Way et al. | 310/11 |
| 4,749,921 A | * | 6/1988 | Chitayat | 318/135 |
| 6,469,406 B1 | * | 10/2002 | Hwang et al. | 310/12 |
| 6,525,803 B2 | * | 2/2003 | Kwan et al. | 355/53 |

FOREIGN PATENT DOCUMENTS

| JP | 08-317627 A | | 11/1996 |
| JP | 2000-245131 | * | 9/2000 |
| JP | 2001-351856 A | | 12/2001 |

OTHER PUBLICATIONS

English translation of Japanese Official Action issued on May 26, 2009 in Japanese Application No. 2006-291469.
Siemens AG, "Simodrive: Linear Motors 1FN1, 1FN3". Planning Guide Jun. 2002 Editition. 2002. pp. 1-308.

* cited by examiner

*Primary Examiner*—Nguyen N Hanh
(74) *Attorney, Agent, or Firm*—Pillsbury Winthrop Shaw Pittman LLP

(57) ABSTRACT

A lithographic apparatus has a patterning support constructed to support a patterning device and a substrate support constructed to support a substrate. At least one of the patterning support and the substrate support is moved by an electromagnetic actuator. The actuator has a first part and a second part that are movable relative to each other. The first part has a coil structure, and the second part including a plurality of permanent magnets interacting with the coil structure. The second part is provided with a cooling structure arranged adjacent the permanent magnets. Cooling ducts are arranged between adjacent permanent magnets, or on a side of the permanent magnets facing the coil structure.

5 Claims, 3 Drawing Sheets

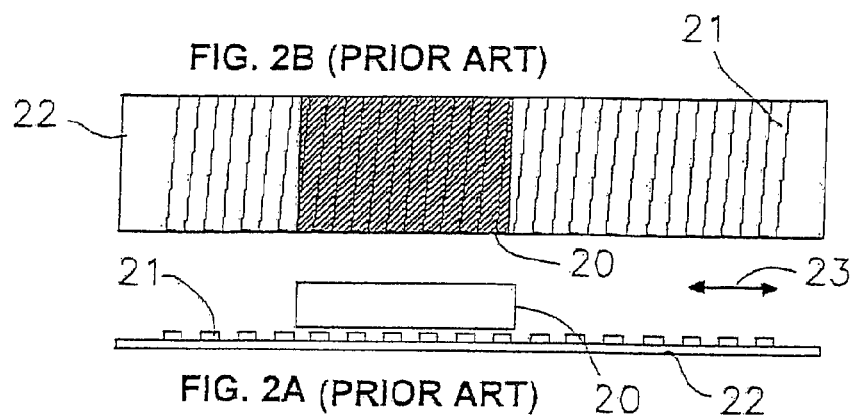
FIG. 2B (PRIOR ART)
FIG. 2A (PRIOR ART)
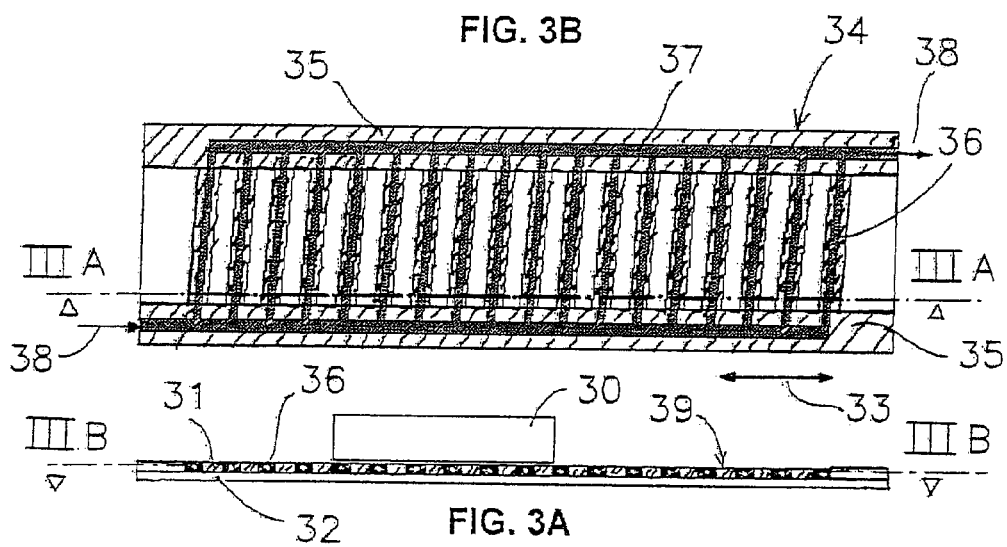
FIG. 3B
FIG. 3A
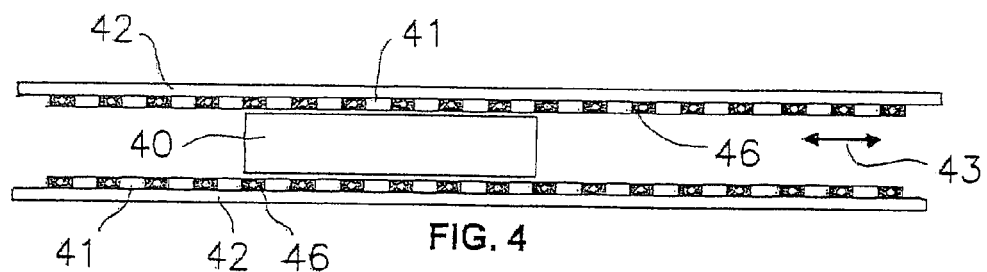
FIG. 4
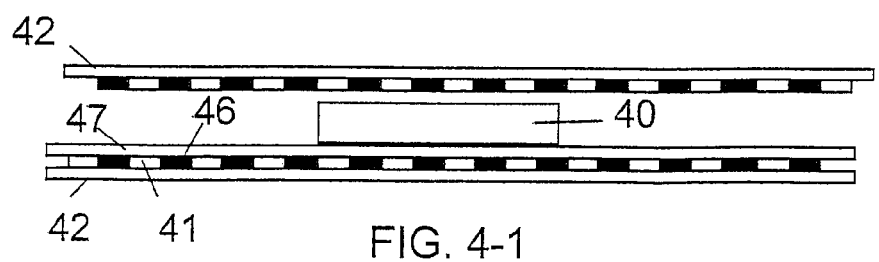
FIG. 4-1

FIG. 5
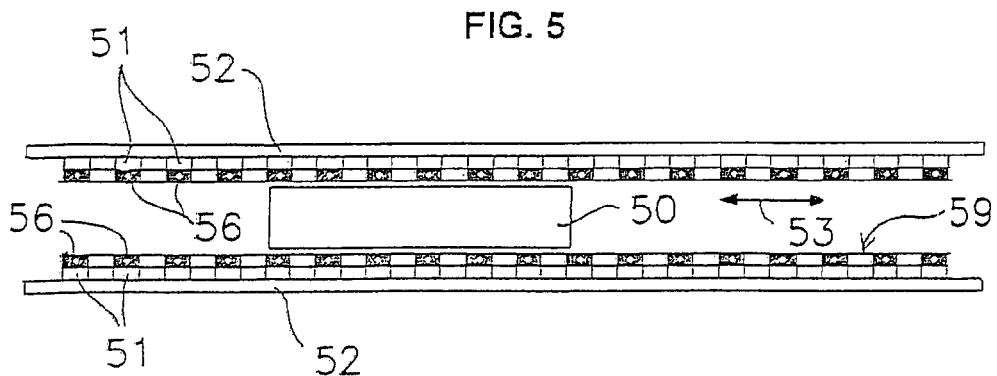
FIG. 6
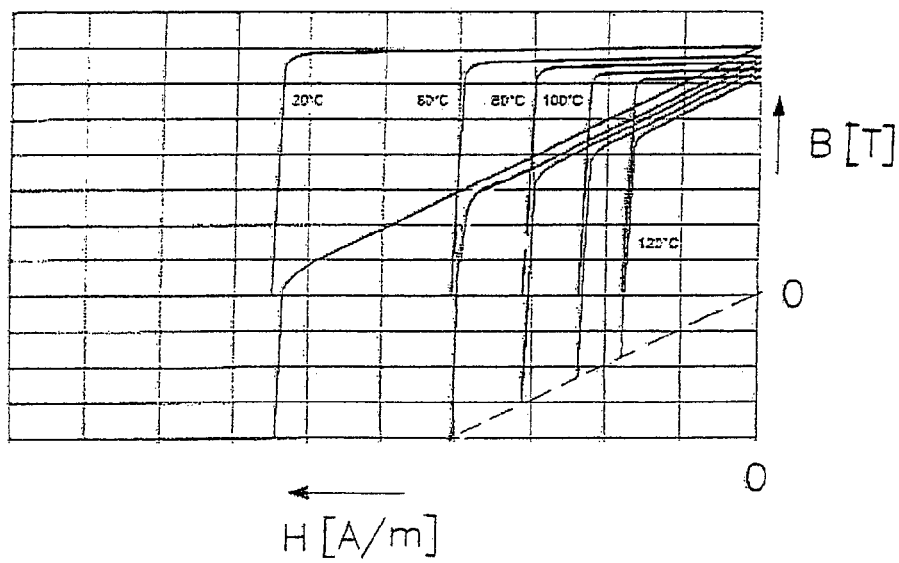
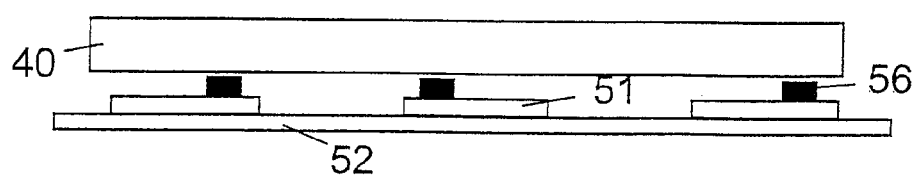
FIG. 5-1

ELECTROMAGNETIC ACTUATOR, METHOD OF MANUFACTURING A PART OF AN ELECTROMAGNETIC ACTUATOR, AND LITHOGRAPHIC APPARATUS COMPRISING AND ELECTROMAGNETIC ACTUATOR

BACKGROUND

1. Field of the Invention

The present invention relates to an electromagnetic actuator, a method of manufacturing a part of an electromagnetic actuator, and a lithographic apparatus comprising an electromagnetic actuator.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Movable parts to be used in a lithographic apparatus, such as patterning device or a substrate (but not limited thereto), are held on a respective movable support during processing. The support is moved in one or more degrees of freedom using an appropriate actuator. Conventionally, such an actuator is of an electromagnetic type having a first part and a second part being movable relative to each other, the first part comprising at least one electric coil, and the second part comprising at least one permanent magnet interacting with the at least one coil. Either the first part or the second part may be coupled to the movable support. The actuator may be an ironless or an iron-core actuator, where the term "iron" represents any magnetizable material.

Conventionally, a cooling of an electric coil of an actuator has been accomplished by a thin plate-like cooling structure of a thermally conducting material in which cooling channels have been formed, such as a sandwich structure. A cooling medium, such as a gas or a liquid, is made to flow through the channels. The cooling structure is placed on, and connected to the coil, in particular at a side thereof facing the at least one permanent magnet, in order to remove heat generated in the coil to prevent the heat from reaching a permanent magnet. A heating of a permanent magnet may lead to a loss of magnetization, and may even lead to an irreversible loss of magnetization, which is to be avoided.

However, it is a trend to decrease the dimensions of actuators, and to increase the electrical load of the at least one coil such as to make the actuator produce higher forces. An increased electrical load leads to an increased generation of heat in the at least one coil. A cooling structure must have reduced dimensions like the actuator. Such a cooling structure placed on the coil does not suffice to remove the heat effectively to keep the at least one permanent magnet substantially free from a heat load. In fact, without further measures the at least one permanent magnet would be heated up through radiation and convection (via air present in an air gap of the actuator between the first part and the second part thereof), thereby changing or reducing the performance of the actuator, which is undesirable.

SUMMARY

It is desirable to provide a high performance electromagnetic actuator having a cooling structure reducing temperature changes of a permanent magnet structure of the actuator.

In an embodiment of the invention, there is provided an electromagnetic actuator comprising a first part and a second part being movable relative to each other, the first part comprising at least one coil, and the second part comprising a number of permanent magnets interacting with the at least one coil, wherein the second part is provided with a cooling structure arranged adjacent the permanent magnets.

In another embodiment of the invention, there is provided a lithographic apparatus comprising: a patterning support constructed to support a patterning device; a substrate support constructed to support a substrate; wherein at least one of the patterning support and the substrate support is moved by an electromagnetic actuator, the actuator comprising a first part and a second part being movable relative to each other, the first part comprising at least one coil, and the second part comprising a number of permanent magnets interacting with the at least one coil, wherein the second part is provided with a cooling structure arranged adjacent the permanent magnets.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2A schematically depicts a side view of an electromagnetic actuator according to the prior art;

FIG. 2B depicts a plan view of the electromagnetic actuator of FIG. 2A;

FIG. 3A schematically depicts a side view, partially in cross-section according to a plane IIIA-IIIA in FIG. 3B, of an electromagnetic actuator according to an embodiment of the present invention;

FIG. 3B illustrates, in plan view, partially in cross-section according to a plane IIIB-IIIB in FIG. 3A, a flow of a cooling medium in a cooling structure included in the embodiment of the electromagnetic actuator of FIG. 3A;

FIG. 4 schematically depicts a side view, partially in cross-section, of an electromagnetic actuator according to an embodiment of the present invention;

FIG. 4-1 schematically depicts a side view, partially in cross-section, of an electromagnetic actuator according to an embodiment of the present invention;

FIG. 5 schematically depicts a side view, partially in cross-section, of an electromagnetic actuator according to an embodiment of the present invention;

FIG. 5-1 schematically depicts a side view, partially in cross-section, of an electromagnetic actuator according to an embodiment of the present invention; and FIG. 6 illustrates the effects of varying temperatures on magnetic properties of a permanent magnet material.

DETAILED DESCRIPTION

Figure 1:
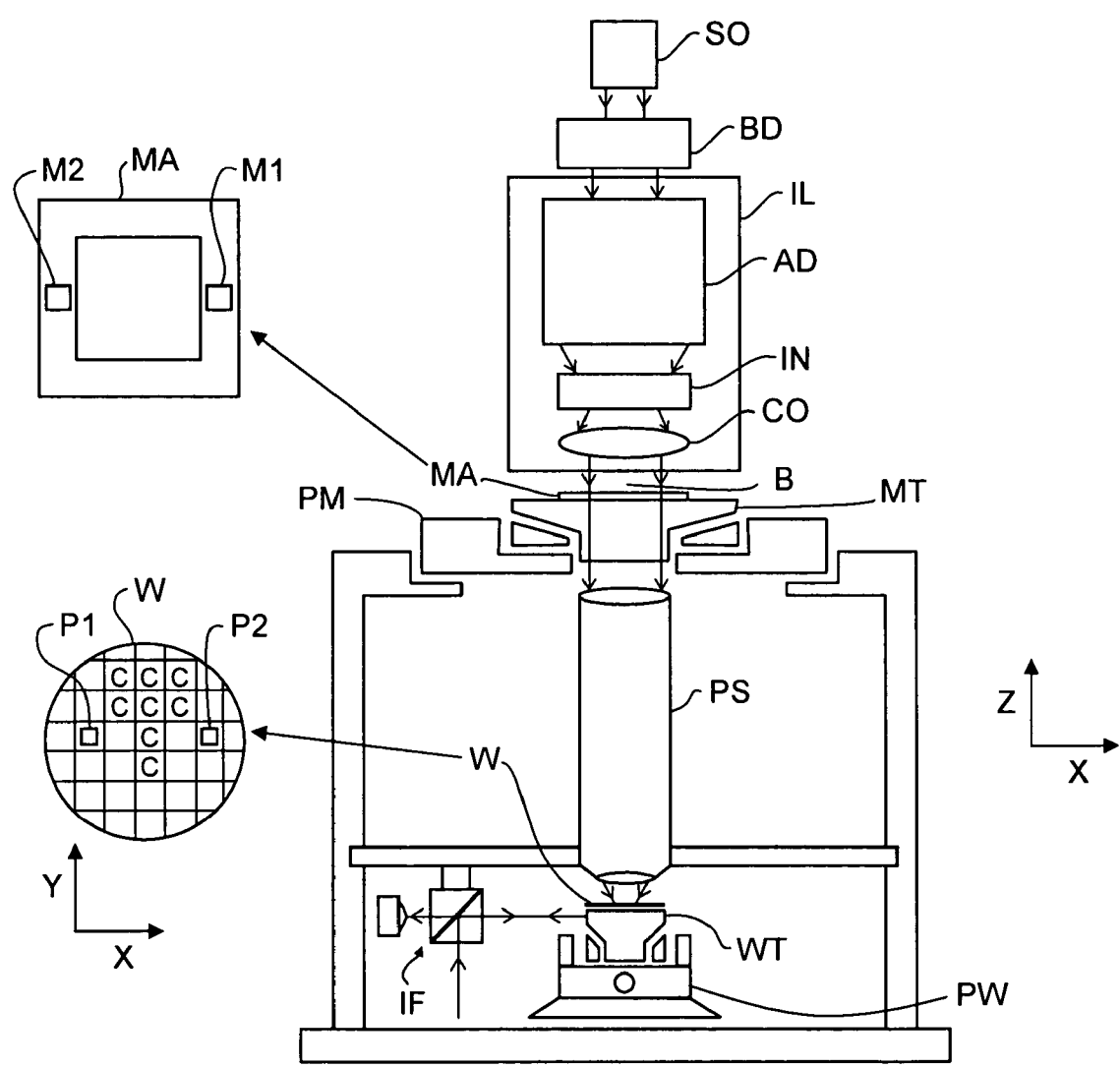
FIG. 1 schematically depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W. The first and/or the second positioning device may comprise one or more electromagnetic actuators according to the present invention.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g.

so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The first positioning device PM and the second positioning device PW may comprise one or more actuators according to embodiments of the present invention, as disclosed in detailed exemplary embodiments below.

The depicted apparatus could be used in at least one of the following modes:

In step mode, the mask table MT or "mask support" and the substrate table WT or "substrate support" are kept essentially stationary, while an entire pattern imparted to the radiation beam is projected onto a target portion C at once (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2A shows a prior art actuator having a coil structure 20, which may comprise one or more electric coils which are connectable to a power source (not shown) for energizing the coil structure 20 such that a desired magnetic field is generated. The coil structure 20 may comprise a structure made from a magnetizable material to guide the magnetic flux generated by the coil structure 20. Across a gap, such as an air gap, the coil structure 20 faces a series of spaced permanent magnets 21 mounted on a carrier 22 made from a magnetizable material. Energizing the coil structure 20 in a predetermined way will lead to the coil structure 20 and the permanent magnets 21 taking a predetermined position relative to each other, or moving relative to each other in either one of the directions indicated by double arrow 23. In general, either the coil structure 20 or the carrier 22 may be arranged stationary, while the other one of the coil structure 20 and the carrier 22 is movable. In the embodiment of FIG. 2A, the coil structure 20 is movable relative to the carrier 22. The spaces between adjacent permanent magnets 21 may be filled with a non-magnetizable material, such as a plastic or resin material. With the coil structure 20 comprising a structure made from a magnetizable material, the gap between the coil structure 20 and the permanent magnets 21 should be made as small as possible. Heat generated by the coil structure 20 when energized may heat up the permanent magnets 21, thus changing the operational characteristics of the actuator.

FIG. 2B illustrates that the permanent magnets 21 may be arranged at an angle different from 90 degrees to the directions of movement 23 of the coil structure 20 or the carrier 22, thus reducing a force ripple during operation of the actuator.

FIGS. 3A and 3B show an actuator according to an embodiment of the present invention, having a coil structure 30, an array of spaced permanent magnets 31, a carrier 32 made from a magnetizable material, and directions of movement 33. The coil structure 30 may comprise a structure made from a magnetizable material to guide the magnetic flux generated by the coil structure 30, or may not comprise a structure made from a magnetizable material.

A cooling structure 34 is provided at least partly on the carrier 32. In the embodiment shown, the cooling structure 34 comprises manifold ducts 35 connected to each other by parallel ducts 36. The ducts 36 are situated between adjacent permanent magnets 31. At least the ducts 36 have a height (a dimension at right angles to the plane of the drawing of FIG. 3B) which is substantially equal to, or less than a height of the permanent magnets 31, thereby not increasing the gap between the coil structure 30 and the permanent magnets 31. The height of the manifold ducts 35 may be equal to, or different from the height of the ducts 36. A cooling medium 37, i.e. a gas or a liquid, such as demineralized water, is made to flow in the directions of the arrows 38 through the manifold ducts 35 and the ducts 36. As will be clear to the skilled person, in an alternative arrangement (not shown), the cooling medium 37 may be made to flow through the ducts 36 in series, or in a combined parallel/series flow path, for which the ducts 35 may adapted accordingly.

The cooling structure may be manufactured by providing a carrier plate (carrier 32), mounting a number of permanent magnets 31 on the carrier plate leaving spaces in between the permanent magnets 31, and mounting a number of cooling ducts 36 in the spaces on the carrier plate, with each permanent magnet 31 being adjacent to at least one of the cooling ducts 36.

In another method of manufacture, the manifold ducts 35 and the ducts 36 may be mounted on a relatively thin second plate 39 overlying the permanent magnets 31 at their side facing the coil structure 30. Part of the actuator may be manufactured by providing a carrier plate (carrier 32), mounting a number of permanent magnets 31 on the carrier plate at a pitch leaving spaces in between the permanent magnets 31, the spaces having a width, providing a second plate 39, mounting a number of cooling ducts 36 having essentially the width on the second plate 39 at that pitch, and assembling the carrier plate with the permanent magnets 31 and the second plate 39 with the cooling ducts 36, with each permanent magnet 31 arranged adjacent to at least one of the cooling ducts 36. In this way a cooling structure may be obtained which can be conveniently handled while not yet mounted on the permanent magnets 31, at the expense of a small increase of the gap between the coil structure 30 and the permanent magnets 31.

The ducts 36 are manufactured from a non-magnetizable material which conducts heat well and does not conduct current well, and the manifold ducts 35 may be manufactured from the same or a similar material, such as a metal, e.g. titanium, or a ceramic material. Inside each manifold duct 35 or duct 36, one or more channels may have been formed for a flow of the cooling medium 37. The ducts 36 may be in direct contact with the permanent magnets 31, thereby greatly reducing or substantially preventing the magnets to be heated up by heat originating from the coil structure 30. If a plate 39 is present, which may be made from the same or a similar material as the ducts 35, 36, the permanent magnets 31 are additionally shielded thermally by the plate 39 from heat originating from the coil structure 30. The plate 39 may be in direct contact with the ducts 36, and may thus be directly cooled thereby.

Instead of ducts 36 combined with a plate 39, the ducts 36 as such may be omitted. In such an embodiment, the plate 39 together with the permanent magnets 31 may form channels for a flow of a cooling medium 37. The permanent magnet part of the actuator may be manufactured by providing a carrier plate (carrier 32), mounting a number of permanent magnets 31 at a first side thereof on the carrier plate leaving spaces in between the permanent magnets 31, providing the second plate 39, and mounting the second plate 39 on the permanent magnets 31 at a second side thereof, the second side being opposite the first side, thereby forming cooling ducts between adjacent permanent magnets 31. A transfer of heat from the plate 39 and from the permanent magnets 31 to the cooling medium 37 is further improved.

FIG. 4 illustrates an embodiment of an actuator comprising a coil structure 40, two arrays of permanent magnets 41, two carriers 42 made from a magnetizable material, and ducts 46 situated between adjacent permanent magnets 41, in an arrangement similar to FIG. 3A. Directions of movement are indicated with double arrow 43. As shown in FIG. 4-1, a second plate 47, similar to the second plate 39 in FIG. 3A, may be mounted on each array of permanent magnets 41 at a side facing away from the corresponding carrier 42.

In an embodiment, the coil structure 40 may not comprise magnetizable material. In such a type of actuator, the gap between the coil structure 40 and the permanent magnets 41 may be larger than in an embodiment having a coil structure which does comprise a magnetizable material.

FIG. 5 illustrates an actuator comprising a coil structure 50, two arrays of permanent magnets 51, two carriers 52 made from a magnetizable material, and directions of movement 53.

Spaces between adjacent permanent magnets 51 may be filled with a non-magnetizable material, such as a plastic or resin material.

In an embodiment, an array of ducts 56 may be mounted on each array of permanent magnets 51 such that a duct 56 overlies a permanent magnet 51, and a duct 56 is situated between the coil structure 50 and a permanent magnet 51. However, the permanent magnets 51 and the ducts 56 may also have different pitches and different widths, as seen in the directions of movement 53 (see, e.g., FIG. 5-1). Spaces between the ducts 56 may be filled with a non-magnetizable material, such as a plastic of resin material. The ducts 56 may be mounted on a plate 59 (similar to the plate 39 in FIG. 3A), or may be formed in a sandwich structure comprising a number of plates in which parts of ducts are recessed. The permanent magnet part of the actuator may be manufactured by providing a carrier plate (carrier 52), mounting a number of permanent magnets 51 at a first side thereof on the carrier plate at a first pitch, providing a cooling structure having a number of cooling ducts 56 at a second pitch; and mounting the cooling structure on the permanent magnets 51 at a second side thereof, the second side being opposite the first side.

FIG. 6 illustrates graphs of the magnetic induction B (in tesla) versus the magnetic field H (in A/m) for different temperatures, for a permanent magnet material. It may be clearly seen that an increasing temperature greatly influences the magnetic properties of the permanent magnet material, and that for optimum performance the temperature should be kept as low as possible using a cooling structure according to any of FIG. 3A, 3B, 4, or 5.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

As required, detailed embodiments of the present invention are disclosed herein. However, it is to be understood that the disclosed embodiments are merely exemplary of the invention, and that the invention may be practiced otherwise than as described. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting, but rather to provide an understandable description of the invention. It will be apparent to one skilled in the art that modifications may be made to the invention as described without departing from the scope of the claims set out below.

What is claimed is:

1. An electromagnetic actuator comprising a first part and a second part that are movable relative to each other, the first part comprising at least one coil, and the second part comprising a plurality of permanent magnets interacting with the at least one coil, the permanent magnets being spaced apart from each other and being mounted on a first plate, wherein the second part is provided with a cooling structure arranged adjacent the permanent magnets, the cooling structure including cooling ducts arranged between adjacent permanent magnets and configured to fully contain a cooling medium that flows therethrough, said cooling structure being mounted on a second plate and the second plate is arranged between the permanent magnets and the at least one coil.

2. The actuator of claim 1, wherein the cooling medium is liquid.

3. The actuator of claim 2, wherein the liquid is demineralized water.

4. An electromagnetic actuator comprising a first part and a second part that are movable relative to each other, the first part comprising at least one coil, and the second part comprising a plurality of permanent magnets interacting with the at least one coil, the permanent magnets being spaced apart from each other, wherein the second part is provided with a cooling structure arranged adjacent the permanent magnets, said cooling structure including cooling ducts configured to fully contain a cooling medium that flows therethrough, wherein the permanent magnets at a first side thereof are mounted on a carrier plate, and at a second side thereof are mounted on another plate, the second side being opposite said first side, thereby forming said cooling ducts between adjacent permanent magnets.

5. A lithographic apparatus comprising:
   a patterning support constructed to support a patterning device;
   a substrate support constructed to support a substrate;
   wherein at least one of the patterning support and the substrate support is moved by an electromagnetic actuator, the actuator comprising a first part and a second part that are movable relative to each other, the first part comprising at least one coil, and the second part comprising a plurality of permanent magnets interacting with the at least one coil, the permanent magnets being spaced apart from each other and being mounted on a first plate, wherein the second part is provided with a cooling structure arranged adjacent the permanent magnets, the cooling structure including cooling ducts arranged between adjacent permanent magnets and configured to fully contain a cooling medium that flows therethrough, said cooling structure being mounted on a second plate and the second plate is arranged between the permanent magnets and the at least one coil.

* * * * *